United States Patent
Cooper et al.

(10) Patent No.: US 10,790,187 B2
(45) Date of Patent: Sep. 29, 2020

(54) POST-ETCH RESIDUE REMOVAL FOR ADVANCED NODE BEOL PROCESSING

(71) Applicant: Entegris, Inc., Billerica, MA (US)

(72) Inventors: Emanuel I. Cooper, Scarsdale, NY (US); Makonnen Payne, White Plains, NY (US); WonLae Kim, Gyeonggi-do (KR); Eric Hong, Suwon-si (KR); Sheng-Hung Tu, Billerica, MA (US); Chieh Ju Wang, Billerica, MA (US); Chia-Jung Hsu, Billerica, MA (US)

(73) Assignee: ENTEGRIS, INC., Billerica, MA (US)

( * ) Notice: Subject to any disclaimer, the term of this patent is extended or adjusted under 35 U.S.C. 154(b) by 157 days.

(21) Appl. No.: 15/873,531

(22) Filed: Jan. 17, 2018

(65) Prior Publication Data
US 2018/0204764 A1 Jul. 19, 2018

Related U.S. Application Data

(60) Provisional application No. 62/447,247, filed on Jan. 17, 2017.

(51) Int. Cl.
| | |
|---|---|
| *C11D 7/50* | (2006.01) |
| *H01L 21/768* | (2006.01) |
| *B08B 7/00* | (2006.01) |
| *H01L 21/02* | (2006.01) |
| *C11D 3/395* | (2006.01) |
| *C23G 1/20* | (2006.01) |
| *C11D 7/32* | (2006.01) |
| *C11D 7/36* | (2006.01) |
| *C11D 3/00* | (2006.01) |
| *C11D 3/39* | (2006.01) |
| *C09K 13/00* | (2006.01) |
| *G03F 7/42* | (2006.01) |
| *C11D 7/26* | (2006.01) |
| *C11D 7/08* | (2006.01) |
| *C23G 1/18* | (2006.01) |
| *C11D 11/00* | (2006.01) |
| *C23G 1/26* | (2006.01) |
| *H01L 21/311* | (2006.01) |

(52) U.S. Cl.
CPC ...... *H01L 21/76814* (2013.01); *B08B 7/0014* (2013.01); *C09K 13/00* (2013.01); *C11D 3/0073* (2013.01); *C11D 3/3947* (2013.01); *C11D 3/3956* (2013.01); *C11D 7/08* (2013.01); *C11D 7/265* (2013.01); *C11D 7/3209* (2013.01); *C11D 7/3245* (2013.01); *C11D 7/3281* (2013.01); *C11D 7/36* (2013.01); *C11D 11/0047* (2013.01); *C23G 1/18* (2013.01); *C23G 1/20* (2013.01); *C23G 1/26* (2013.01); *G03F 7/423* (2013.01); *G03F 7/425* (2013.01); *H01L 21/02063* (2013.01); *H01L 21/31111* (2013.01)

(58) Field of Classification Search
CPC .................................................. C11D 11/0047
USPC ........................................................... 510/175
See application file for complete search history.

(56) References Cited

U.S. PATENT DOCUMENTS

| | | | |
|---|---|---|---|
| 2007/0060490 A1* | 3/2007 | Skee | C11D 3/0073 510/175 |
| 2016/0130500 A1* | 5/2016 | Chen | C11D 3/30 216/13 |

FOREIGN PATENT DOCUMENTS

| | | |
|---|---|---|
| TW | 200523690 A | 7/2005 |
| WO | 02/33033 A1 | 4/2002 |
| WO | 2005/043245 A2 | 5/2005 |
| WO | 2014/197808 A1 | 12/2014 |

* cited by examiner

*Primary Examiner* — Gregory E Webb
(74) *Attorney, Agent, or Firm* — Entegris, Inc.

(57) ABSTRACT

The disclosure relates to a cleaning composition that aids in the removal of post-etch residues and aluminum-containing material, e.g., aluminum oxide, in the production of semiconductors that utilize an aluminum-containing etch stop layer. The compositions have a high selectivity for post-etch residue and aluminum-containing materials relative to low-k dielectric materials, cobalt-containing materials and other metals on the microelectronic device.

14 Claims, No Drawings

POST-ETCH RESIDUE REMOVAL FOR ADVANCED NODE BEOL PROCESSING

RELATED APPLICATIONS

This application claims the benefit of U.S. Provisional Application No. 62/447,247 filed on Jan. 17, 2017, the entire disclosure of which is incorporated in its entirety by reference herein.

FIELD OF THE INVENTION

The present disclosure relates to compositions for the removal of post-etch residue from microelectronic devices and methods of making and using the same, wherein the compositions have a high selectivity for post-etch residue and aluminum-containing materials relative to low-k dielectric materials, cobalt-containing materials and other metals on the microelectronic device.

BACKGROUND

As device nodes shrink below 10 nanometers (nm) in advanced semiconductor manufacturing, new materials are introduced for better device performance and manufacturability. Examples of new materials being considered include cobalt via contacts, aluminum-containing etch stop layers, and titanium nitride barrier layers.

Post etch cleaning chemistry that is compatible with cobalt-containing materials, titanium nitride, and low-k dielectric materials enables manufacturing processes at the smaller and more advanced nodes. In the back end of line (BEOL), copper (Cu) is still used as an interconnect metal line, so a cleaning chemistry formulation that is compatible with copper as well as the new materials is advantageous.

There is a need for cleaning compositions with controlled etch rate and selectivity for post-etch residue and aluminum-containing materials, e.g., aluminum oxide, over other layers in the device which can include cobalt-containing materials, copper, low-k dielectrics, and titanium nitride barrier layers.

SUMMARY

The problem of post etch residue removal during manufacturing of microelectronic devices utilizing cobalt via contacts, low-k dielectric material, and copper interconnects is solved by a composition that has an etch rate selectivity for the post-etch residue and aluminum-containing materials over other layers such as cobalt-containing layers, copper, and low-k dielectric materials, including ultra low-k dielectric materials.

DESCRIPTION

Cleaning compositions with etch selectivity for aluminum-containing materials, e.g., aluminum oxide, over other layers such as cobalt-containing materials, copper interconnects, and low-k dielectric materials, are described herein. Further, methods of using said cleaning compositions to efficiently remove post-etch residue and aluminum-containing etch stop layers, including aluminum oxide, from the microelectronic device are described herein.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

As used herein, "about" is intended to correspond to ±5% of the stated value.

"Substantially devoid" is defined herein as less than 2 wt. %, preferably less than 1 wt. %, more preferably less than 0.5 wt. %, even more preferably less than 0.1 wt. %, and most preferably 0 wt. %.

As defined herein, "aluminum-containing materials" include aluminum-containing etch stop layers, for example, aluminum oxide or aluminum nitride.

As defined herein, "aluminum oxide" can be represented by $Al_xO_y$, signifying that the aluminum oxide may be of varying stoichiometry and may include different oxides of aluminum (e.g., $Al_2O_3$), depending on the original aluminum-containing reactant and the method of deposition, as well as the presence of any impurities. The aluminum oxide can be deposited under physical vapor deposition (PVD), atomic layer deposition (ALD) or chemical vapor deposition (CVD).

As defined herein, "low-k dielectric material" corresponds to any material used as a dielectric material in a layered microelectronic device, wherein the material has a dielectric constant less than about 3.5. Low-k dielectric materials include ultra low-k dielectric materials. Preferably, the low-k dielectric materials include low-polarity materials such as silicon-containing organic polymers, silicon-containing hybrid organic/inorganic materials, organosilicate glass (OSG), tetraethyl orthosilicate (TEOS), fluorinated silicate glass (FSG), silicon dioxide, and carbon-doped oxide (CDO) glass. It is to be appreciated that the low-k dielectric materials may have varying densities and varying porosities.

As described herein, the "silicon dioxide" or "$SiO_2$" material corresponds to materials that were deposited from a silicon oxide precursor source, e.g., TEOS, thermally deposited silicon oxide, or carbon doped oxides (CDO) deposited using commercially available precursors such as SiLK™, AURORA™, CORAL™, or BLACK DIAMOND™. For the purposes of this description, "silicon dioxide" is meant to broadly include $SiO_2$, CDO's, siloxanes and thermal oxides. Silicon dioxide or $SiO_2$ material corresponds to pure silicon dioxide ($SiO_2$) as well as impure silicon dioxide including impurities in the structure.

"Post-etch residue," as used herein, corresponds to material remaining following gas-phase plasma etching processes, e.g., BEOL dual-damascene processing. The post-etch residue may be organic, organometallic (e.g., organosilicic), or inorganic in nature, and may include, for example, a silicon-containing material, a titanium-containing material, a nitrogen-containing material, an oxygen-containing material, a polymeric residue material, a copper-containing residue material (including copper oxide residue), a tungsten-containing residue material, a cobalt-containing residue material, an etch gas residue such as chlorine and fluorine, and combinations thereof.

As used herein, "suitability" for removing aluminum-containing materials and/or post-etch residue from a microelectronic device having said material(s) thereon corresponds to at least partial removal of said aluminum-containing materials and/or post-etch residue material(s)

from the microelectronic device. Preferably, at least about 90% of the material(s), more preferably at least 95% of the material(s), and most preferably at least 99% of the material(s), are removed from the microelectronic device using the composition described herein.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.00001 weight percent, based on the total weight of the composition in which such components are employed.

In a first aspect, a cleaning composition is described, wherein the cleaning composition is aqueous and comprises (a) a concentrate comprising, consisting of, or consisting essentially of at least one metal corrosion inhibitor, at least one etchant source, at least one silica source, at least one chelating agent, and at least one solvent, and (b) at least one oxidizing agent, wherein the concentrate is combined with at least one oxidizing agent to form said cleaning composition, wherein the cleaning composition is suitable for removing post-etch residues and aluminum-containing materials from the surface of a microelectronic device having same thereon. The post-etch residue can comprise at least one species selected from the group consisting of titanium-containing residues, polymeric residues, copper-containing residues, cobalt-containing residues, silicon-containing residues, and combinations thereof.

In some versions of the disclosure the etchant source can include ammonium hydroxide or a tetraalkylammonium hydroxide base having the formula $NR^1R^2R^3R^4OH$, wherein $R^1$, $R^2$, $R^3$ and $R^4$ may be the same as or different from one another and are selected from the group consisting of hydrogen, straight-chain or branched $C_1$-$C_6$ alkyl (e.g., methyl, ethyl, propyl, butyl, pentyl, and hexyl) groups, $C_1$-$C_6$ hydroxyalkyl (e.g., hydroxymethyl, hydoxyethyl, hydroxypropyl, hydroxybutyl, hydroxypentyl, and hydroxyhexyl) groups, and substituted or unsubstituted $C_6$-$C_{10}$ aryl groups, (e.g., benzyl groups). Tetraalkylammonium hydroxides that are commercially available include tetramethylammonium hydroxide (TMAH), tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, and combinations thereof, may be used. Alternatively, the etchant source can be a quaternary trialkylalkanolamine base including, but are not limited to, salts of quaternary amines such as trimethylpropanolamine, triethylethanolamine, dimethylethylethanolamine, diethylmethylethanolamine, dimethylethylpropanolamine, diethylmethylpropanolamine, and triethylpropanolamine. The one or more etchant sources can comprise between about 0.1 wt % and about 20 wt % of the concentrate, based on the total weight of the concentrate. In some embodiments, the one or more etchant sources can comprise between about 0.1 wt % and about 10 wt % of the concentrate, based on the total weight of the concentrate. In other embodiments, the one or more etchant sources can comprise between about 10 wt % and about 20 wt % of the concentrate, based on the total weight of the concentrate. Preferably, the at least one etchant source comprises choline hydroxide.

The metal corrosion inhibitor can be used to protect the contact metals such as Cu and Co. The metal corrosion inhibitor can comprise, consist, or consist essentially of one or more corrosion inhibitors including, but not limited to, 5-aminotetrazole, 5-phenyl-benzotriazole, 1H-tetrazole-5-acetic acid, 1-phenyl-2-tetrazoline-5-thione, benzimidazole, methyltetrazole, pyrazoles, 5-amino-1,3,4-thiadiazole-2-thiol (ATDT), benzotriazole (BTA), 1,2,4-triazole (TAZ), 1,2,3-triazole, tolyltriazole, 5-methyl-benzotriazole (mBTA), 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole (3-ATA), 3-mercapto-1,2,4-triazole, 3-isopropyl-1,2,4-triazole, 5-phenylthio-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-amino-1,2,4-triazole (5-ATA), 3-amino-5-mercapto-1,2,4-triazole, pentylenetetrazole, 5-phenyl-1H-tetrazole, 5-benzyl-1H-tetrazole, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 4-amino-4H-1,2,4-triazole, 3-amino-5-methylthio-1H-1,2,4-triazole, benzothiazole, imidazole, indiazole, adenine, adenosine, carbazole, and combinations thereof. The range for the amount of corrosion inhibitor(s) in the concentrate is an amount that provides an essentially inhibitor independent Cu etch rate of about 2 Å/min or less, and a cobalt etch rate of about 2 Å/min or less, as measured on coupon samples submerged in beakers with the cleaning composition, i.e., comprising the at least one oxidizing agent. For example, the amount of the one or more corrosion inhibitors in the concentrate can be in a range from about 0.01 wt % to about 5 wt %, based on the total weight of the concentrate. In other embodiments, the amount of the one or more corrosion inhibitors in the concentrate can be about 0.1 wt % to about 2 wt % or about 2 wt % to about 5 wt %, based on the total weight of the concentrate. Preferably, the at least one corrosion inhibitor comprises TAZ, mBTA, tolyltriazole, or any combination thereof.

The chelating or metal complexing agent can include, but is not limited to, 4-(2-hydroxyethyl)morpholine (HEM), 1,2-cyclohexanediamine-N,N,N',N'-tetraacetic acid (CDTA), ethylenediaminetetraacetic acid (EDTA), m-xylenediamine (MXDA), iminodiacetic acid (IDA), 2-(hydroxyethyl)iminodiacetic acid (HIDA), nitrilotriacetic acid, thiourea, 1,1,3,3-tetramethylurea, urea, urea derivatives, uric acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, phosphonates (e.g., 1-hydroxyethylidene-1,1-diphosphonic acid (HEDP), 1,5,9-triazacyclododecane-N,N',N"-tris(methylenephosphonic acid) (DO-TRP), 1,4,7,10-tetraazacyclododecane-N,N',N",N'"-tetrakis(methylenephosphonic acid) (DOTP), nitrilotris(methylene) triphosphonic acid, diethylenetriaminepentakis(methylenephosphonic acid) (DETAP), aminotri(methylenephosphonic acid), bis(hexamethylene)triamine pentamethylene phosphonic acid, 1,4,7-triazacyclononane-N,N',N"-tris(methylenephosphonic) acid (NOTP), hydroxyethyldiphosphonate, nitrilotris(methylene)phosphonic acid, 2-phosphono-butane-1,2,3,4-tetracarboxylic, carboxyethyl phosphonic acid, aminoethyl phosphonic acid, glyphosate, ethylene diamine tetra(methylenephosphonic acid) phenyl-phosphonic acid, salts thereof, and derivatives thereof), carboxylic acids (e.g., oxalic acid, succinnic acid, maleic acid, malic acid, malonic acid, adipic acid, phthalic acid, citric acid, sodium citrate, potassium citrate, ammonium citrate, tricarballylic acid, trimethylolpropionic acid, tartaric acid, glucuronic acid, and 2-carboxypyridine), phosphate salts, phosphoric acids, sulfonic acids, heterocyclic amine N-oxides (e.g., 3,5-dimethylpyridine N-oxide, 3-methyl-pyridine N-oxide, 4-methylmorpholine-N-oxide (NMMO), 2-methylpyridine N-oxide, N-methyl piperidine-N-oxide, and 4-ethylmorpholine-N-oxide), and any combination thereof. The amount of the one or more chelating agents in the concentrate can be in a range from about 0.01 wt % to about 10 wt %, based on the total weight of the concentrate. In other embodiments, the amount of the one or more chelating agents in the concentrate can be about 0.1 wt % to about 5 wt % or about 5 wt % to about 10 wt %, based on the total weight of the concentrate. It is noted that when the at least one chelating agent is a heterocyclic amine N-oxide, the heterocyclic amine N-oxide can be made in-situ using an unoxidized precursor molecule in the presence of an oxidizer. Further, it should be appreciated that the heterocyclic amine N-oxides can also act oxidizing agents, however, for the purposes of this disclosure, they are present in the concentrate and characterized as chelating agents. Preferably, the at least one chelating agent comprises at least one of EDTA, CDTA, HEDP, oxalic acid, and NMMO, preferably at least one of CDTA, HEDP, and NMMO.

The at least one silica source preferably comprises fluorosilicic acid ($H_2SiF_6$). It should be appreciated that the fluorosilicic acid can be prepared in situ by combining at least one fluoride source (e.g., HF, ammonium fluoride, ammonium bifluoride, tetraalkylammonium fluoride ($NR_1R_2R_3R_4F$), where $R_1$, $R_2$, $R_3$, $R_4$ may be the same as or different from one another and is selected from the group consisting of hydrogen, straight-chain or branched $C_1$-$C_6$ alkyl (e.g., methyl, ethyl, propyl, butyl, pentyl, and hexyl) groups, $C_1$-$C_6$ hydroxyalkyl (e.g., hydroxyethyl and hydroxypropyl) groups, substituted or unsubstituted aryl groups (e.g., benzyl), weak bases, and combinations thereof) with at least one silicon-containing compound such as an alkoxysilane, ammonium hexafluorosilicate, sodium silicate, tetramethyl ammonium silicate (TMAS), and combinations thereof. Alkoxysilanes contemplated have the general formula $SiR^1R^2R^3R^4$, wherein the $R^1$, $R^2$, $R^3$ and $R^4$ are the same as or different from one another and are selected from the group consisting of straight-chain $C_1$-$C_6$ alkyl (e.g., methyl, ethyl, propyl, butyl, pentyl, and hexyl) groups, branched $C_1$-$C_6$ alkyl groups, $C_1$-$C_6$ alkoxy (e.g., methoxy, ethoxy, propoxy, butoxy, pentoxy, and hexoxy) groups, a phenyl group, and a combination thereof. It should be appreciated by the skilled artisan, that to be characterized as an alkoxysilane, at least one of $R^1$, $R^2$, $R^3$ or $R^4$ must be a $C_1$-$C_6$ alkoxy group. Alkoxysilanes contemplated include methyltrimethoxysilane, dimethyldimethoxysilane, phenyltrimethoxysilane, tetraethoxysilane (TEOS), N-propyltrimethoxysilane, N-propyltriethoxysilane, hexyltrimethoxysilane, hexyltriethoxysilane, and combinations thereof. The amount of the one or more silica sources in the concentrate can be in a range from about 0.01 wt % to about 5 wt %, based on the total weight of the concentrate. In other embodiments, the amount of the one or more silica sources in the concentrate can be about 0.01 wt % to about 2 wt % or about 2 wt % to about 5 wt %, based on the total weight of the concentrate.

The at least one solvent preferably comprises water, even more preferably deionized water. Water can comprise from about 60 wt % to about 98 wt % of the cleaning composition, based on the total weight of the cleaning composition. It should be appreciated that less water may be present in the concentrate but can be added to the cleaning composition at the same time as the at least one oxidizing agent to yield a cleaning composition having the foregoing amount of water.

To form the cleaning composition described herein, the concentrate is mixed with at least one oxidizing agent. Oxidizing agents contemplated herein include, but are not limited to, hydrogen peroxide ($H_2O_2$), $FeCl_3$, $FeF_3$, $Fe(NO_3)_3$, $Sr(NO_3)_2$, $CoF_3$, $MnF_3$, oxone, ($2KHSO_5 \cdot KHSO_4 \cdot K_2SO_4$), nitric acid ($HNO_3$), ammonium polyatomic salts (e.g., ammonium peroxomonosulfate, ammonium chlorite ($NH_4ClO_2$), ammonium chlorate ($NH_4ClO_3$), ammonium iodate ($NH_4IO_3$), ammonium nitrate ($NH_4NO_3$), ammonium perborate ($NH_4BO_3$), ammonium perchlorate ($NH_4ClO_4$), ammonium periodate ($NH_4IO_4$), ammonium persulfate (($NH_4)_2S_2O_8$), ammonium hypochlorite ($NH_4ClO$), and ammonium tungstate (($NH_4)_{10}H_2(W_2O_7)$)), sodium polyatomic salts (e.g., sodium persulfate ($Na_2S_2O_8$), sodium hypochlorite (NaClO), and sodium perborate), potassium polyatomic salts (e.g., potassium iodate ($KIO_3$), potassium permanganate ($KMnO_4$), potassium persulfate ($K_2S_2O_8$), and potassium hypochlorite (KClO)), tetramethylammonium polyatomic salts (e.g., tetramethylammonium chlorite (($N(CH_3)_4)ClO_2$), tetramethylammonium chlorate (($N(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), and tetramethylammonium persulfate (($N(CH_3)_4)S_2O_8$)), tetrabutylammonium polyatomic salts (e.g., tetrabutylammonium peroxomonosulfate), peroxomonosulfuric acid, ferric nitrate ($Fe(NO_3)_3$), urea hydrogen peroxide (($CO(NH_2)_2$) $H_2O_2$), peracetic acid ($CH_3(CO)OOH$), 1,4-benzoquinone, toluquinone, dimethyl-1,4-benzoquinone, chloranil, alloxan, and combinations thereof. Preferably, the at least one oxidizing agent comprises hydrogen peroxide.

The cleaning composition can be prepared by combining the concentrate and the oxidizing agent, for example, by adding at least one oxidizing agent to the concentrate. For example, the cleaning compositions can be made by mixing 10 parts of the concentrate with between from about 0.1 parts to about 1 part oxidizing agent. In a particularly preferred embodiment, the amount of at least one oxidizing agent is less than about 10 wt %, even more preferably less than about 8 wt %, based on the total weight of the cleaning composition. In one embodiment, the cleaning composition can comprise hydrogen peroxide and the concentrate. For example, the cleaning compositions can be made by mixing 10 parts of the concentrate with between from about 0.1 parts of 30% $H_2O_2$ up to about 3 parts 30% $H_2O_2$.

The pH of the cleaning composition, following combination of the concentrate and the at least one oxidizing agent, is in a range of about 6 to about 10, preferably in a range from about 6 to about 9.5, even more preferably in a range from about 6 to about 9. In another embodiment, the pH of the cleaning composition, following combination of the concentrate and the at least one oxidizing agent, is preferably in a range from greater than 7 to about 9.5, preferably greater than 7 to about 9.

The cleaning composition of the first aspect is preferably substantially devoid of at least one of a metal halide, amidoxime compounds, organic solvents, and carboxylates. As defined herein, the "metal halide" includes the formula $W_zMX_y$ where M is a metal selected from the group Si, Ge, Sn, Pt, P, B, Au, Ir, Os, Cr, Ti, Zr, Rh, Ru, and Sb; X is a halide selected from F, Cl, Br and I; W is selected from H, to an alkali or alkaline earth metal, and a metal ion-free hydroxide base moiety; y is a numeral of from 4 to 6 depending on the metal halide; and z is a numeral of 1, 2 or 3. As defined herein, the "carboxylates" include potassium citrate tribasic monohydrate, potassium sodium tartrate tetrahydrate, potassium L-lactate, and ammonium carboxylates selected from the group consisting of ammonium oxalate, ammonium lactate, ammonium tartrate, ammonium citrate tribasic, ammonium acetate, ammonium carbamate, ammonium carbonate, ammonium benzoate, ammonium ethylenediaminetetraacetic acid, diammonium ethylenediaminetetraacetic acid, triammonium ethylenediaminetetraacetic acid, tetraammonium ethylenediaminetetraacetic acid, ammonium succinate, ammonium formate, and ammonium 1-H-pyrazole-3-carboxylate. For the purposes of this disclosure, "organic solvents" include dimethyl sulfoxide, ethylene glycol, ethylene glycol alkyl ether, diethylene glycol alkyl ether, triethylene glycol alkyl ether, propylene glycol, propylene glycol alkyl ether, N-substituted pyrrolidone, ethylene diamine, and ethylene triamine.

In a preferred embodiment, the cleaning composition is formulated to ensure an aluminum oxide etch rate greater than about 10 Å/min, preferably greater than about 20 Å/min, and most preferably in a range from about 20 to about 30 Å/min. Advantageously, the cleaning composition described herein is suitable for removing aluminum-containing materials and/or post-etch residue from a microelectronic device having said material(s) thereon while not substantially damaging cobalt-containing layers, copper, or low-k dielectric layers, including ultra low-k dielectric layers, that are also present on the microelectronic device.

The cleaning compositions described herein are easily formulated by simple addition of the respective ingredients of the concentrate with the at least one oxidizing agent and mixing to homogeneous condition. Alternatively, the cleaning compositions described herein are easily formulated by simple addition of the respective ingredients of the concentrate with the at least one oxidizing agent and additional water and mixing to homogeneous condition. Furthermore, the compositions may be readily formulated as multi-part formulations that are mixed at the point of use. The individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, a second aspect relates to a kit including, in one or more containers, one or more components adapted to form the compositions described herein. The kit may include, in one or more containers, a concentrate comprising, consisting of, or consisting essentially of at least one metal corrosion inhibitor, at least one etchant source, at least one silica source, at least one chelating agent, and at least one solvent, for combining with at least one oxidizing agent at a fab or at the point of use. Alternatively, the kit may include, in one or more containers, a concentrate comprising, consisting of, or consisting essentially of at least one metal corrosion inhibitor, at least one etchant source, at least one silica source, at least one chelating agent, and at least one solvent, for combining with at least one oxidizing agent and additional water at the fab or the point of use. The containers of the kit must be suitable for storing and shipping said cleaning compositions, and may be, for example, NOWPak® containers (Entegris, Inc., Billerica, Mass., USA).

The one or more containers which contain the components of the cleaning composition preferably include means for bringing the components in said one or more containers in fluid communication for blending and dispensing. For example, referring to the NOWPak® containers, gas pressure may be applied to the outside of a liner in said one or more containers to cause at least a portion of the contents of the liner to be discharged and hence enable fluid communication for blending and dispensing. Alternatively, gas pressure may be applied to the head space of a conventional pressurizable container, or a pump may be used to enable fluid communication. In addition, the system preferably includes a dispensing port for dispensing the blended cleaning composition to a process tool.

In a third aspect, the cleaning composition of the first aspect is used for removing post-etch residue and aluminum-containing materials, e.g., aluminum oxide, from microelectronic devices having same thereon. The cleaning composition typically is statically or dynamically contacted with the device for a time of from about 1 minute to about 30 minutes, preferably about 1 minute to 10 minutes, at temperature in a range of from about 20° C. to about 90° C., preferably about 30° C. to about 70° C., and most preferably about 35° C. to about 65° C. Such contacting times and temperatures are illustrative, and any other suitable time and temperature conditions may be employed that are efficacious to at least partially remove the post-etch residue and the aluminum-containing material from the device. "At least partial removal" of the residue and aluminum-containing material from the microelectronic device corresponds to removal of at least 90% of the material, preferably at least 95% removal. Most preferably, at least 99% of said material is removed using the cleaning compositions described herein.

In post-etch residue and aluminum-containing material removal application, the cleaning composition may be applied in any suitable manner to the device to be cleaned, e.g., by spraying the composition on the surface of the device to be cleaned, by dipping the device to be cleaned in a static or dynamic volume of the composition, by contacting the device to be cleaned with another material, e.g., a pad, or fibrous sorbent applicator element, that has the composition absorbed thereon, or by any other suitable means, manner or technique by which the composition is brought into removal contact with the device to be cleaned. Further, batch or single wafer processing is contemplated herein.

Following the achievement of the desired residue and aluminum-containing material removal, the cleaning composition may be readily removed from the device to which it has previously been applied, as may be desired and efficacious in a given end use application of the compositions described herein. Preferably, a rinse solution may be used, wherein the rinse solution includes deionized water. Thereafter, the device may be dried using nitrogen or a spin-dry cycle.

Yet another aspect relates to the improved microelectronic devices made according to the methods described herein and to products containing such microelectronic devices.

A still further aspect relates to methods of manufacturing an article comprising a microelectronic device, said method comprising contacting the microelectronic device with a cleaning composition for sufficient time to clean post-etch residue and aluminum-containing material from the microelectronic device having said residue and material thereon, and incorporating said microelectronic device into said article, using a cleaning composition described herein.

Another aspect relates to an article of manufacture comprising a cleaning composition, a microelectronic device wafer, and material selected from the group consisting of post-etch residue, aluminum-containing material, and combinations thereof, wherein the cleaning composition comprises (a) a concentrate comprising, consisting of, or consisting essentially of at least one metal corrosion inhibitor, at least one etchant source, at least one silica source, at least one chelating agent, and at least one solvent, and (b) at least one oxidizing agent.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A cleaning composition comprising (a) a concentrate comprising at least one metal corrosion inhibitor, at least one etchant source, at least one silica source, at least one chelating agent, and at least one solvent, and (b) at least one oxidizing agent, wherein the cleaning composition is suitable for removing both post-etch residue and aluminum-containing etch stop materials from a surface of a microelectronic device having same thereon; wherein the cleaning composition is devoid of metal halide.

2. The cleaning composition of claim 1, wherein the post-etch residue comprises at least one species selected from the group consisting of titanium-containing residues, polymeric residues, copper-containing residues, cobalt-containing residues, silicon-containing residues, and combinations thereof.

3. The cleaning composition of claim 1, wherein the at least one etchant source comprises ammonium hydroxide or a tetraalkylammonium hydroxide.

4. The cleaning composition of claim 3, wherein the at least one etchant source comprises choline hydroxide.

5. The cleaning composition of claim 1, wherein the at least one metal corrosion inhibitor comprises 1,2,4-triazole (TAZ), 5-methyl-benzotriazole (mBTA), tolyltriazole, or combinations thereof.

6. The cleaning composition of claim 1, wherein the at least one chelating agent is ethylenediaminetetraacetic acid (EDTA), 1,2-cyclohexanediamine-N,N,N',N'-tetraacetic acid (CDTA), 1-hydroxyethylidene-1,1-diphosphonic acid (HEDP), oxalic acid, or 4-methylmorpholine-N-oxide (NMMO).

7. The cleaning composition of claim 6, wherein the at least one chelating agent is 1,2-cyclohexanediamine-N,N,N',N'-tetraacetic acid (CDTA), 1-hydroxyethylidene-1,1-diphosphonic acid (HEDP), or 4-methylmorpholine-N-oxide (NMMO).

8. The cleaning composition of claim 1, wherein the at least one silica source comprises fluorosilicic acid ($H_2SiF_6$).

9. The cleaning composition of claim 8, wherein the fluorosilicic acid is generated in situ by combining at least one fluoride source and at least one silicon-containing compound.

10. The cleaning composition of claim 1, wherein the at least one oxidizing agent comprises hydrogen peroxide.

11. The cleaning composition of claim 1, wherein the cleaning composition comprises 10 parts of the concentrate with between from about 0.1 parts to about 1 part oxidizing agent.

12. The cleaning composition of claim 1, wherein the amount of the at least one oxidizing agent is less than about 10 wt% based on a total weight of the cleaning composition.

13. The cleaning composition of claim 1, wherein the at least one solvent comprises water.

14. The cleaning composition of claim 1, wherein the microelectronic device comprises cobalt-containing layers, low-k dielectric layers, and copper.

* * * * *